United States Patent
Fujiki et al.

(10) Patent No.: US 10,446,422 B2
(45) Date of Patent: Oct. 15, 2019

(54) METHOD OF CONTROLLING DISPLAY OF OPERATION OF SEMICONDUCTOR MANUFACTURING APPARATUS AND NON-TRANSITORY COMPUTER READABLE STORAGE MEDIUM THEREFOR, AND SYSTEM FOR PERFORMING DISPLAY CONCERNING OPERATION OF SEMICONDUCTOR MANUFACTURING APPARATUS

(71) Applicant: EBARA CORPORATION, Tokyo (JP)

(72) Inventors: Masayuki Fujiki, Tokyo (JP); Hideharu Aoyama, Tokyo (JP); Ryuya Koizumi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 15/941,760

(22) Filed: Mar. 30, 2018

(65) Prior Publication Data

US 2018/0286723 A1 Oct. 4, 2018

(30) Foreign Application Priority Data

Mar. 31, 2017 (JP) .................. 2017-070972

(51) Int. Cl.
*G06F 3/0484* (2013.01)
*H01L 21/67* (2006.01)
(Continued)

(52) U.S. Cl.
CPC ........ *H01L 21/67276* (2013.01); *C25D 17/00* (2013.01); *C25D 17/001* (2013.01); *C25D 21/12* (2013.01); *G05B 19/46* (2013.01); *G06F 3/04847* (2013.01); *G06F 3/147* (2013.01); *G06T 13/80* (2013.01); *G06T 2200/24* (2013.01); *Y02P 90/02* (2015.11)

(58) Field of Classification Search
CPC ............................ G06F 3/147; G06F 3/04847
See application file for complete search history.

(56) References Cited

U.S. PATENT DOCUMENTS 10,089,773 B1 * 10/2018 Haravu .................. G06T 13/80
2009/0024239 A1 * 1/2009 Yoshioka ............... G06Q 10/06
700/110

(Continued)

FOREIGN PATENT DOCUMENTS

JP        2015-211133 A      11/2015

*Primary Examiner* — David E Choi
(74) *Attorney, Agent, or Firm* — Baker & Hostetler LLP

(57) ABSTRACT

A method is provided, the method including: repeatedly acquiring a state of one or more devices included in the semiconductor manufacturing apparatus; providing a first animation indicating an operation of the semiconductor manufacturing apparatus by displaying at least an image indicating the state of one or more devices on a display unit each time the state is acquired; storing, in a memory, the acquired state of one or more devices and a time related to the state; receiving an input for switching a display mode; and providing a second animation of the semiconductor manufacturing apparatus by displaying, one by one on the display unit, at least one or more images respectively indicating the state of one or more devices related to one or more times including a reference time stored in the memory, after receiving the input for switching a display mode.

12 Claims, 18 Drawing Sheets

(51) Int. Cl.
*C25D 17/00* (2006.01)
*G06F 3/147* (2006.01)
*G05B 19/46* (2006.01)
*C25D 21/12* (2006.01)
*G06T 13/80* (2011.01)

(56) References Cited

U.S. PATENT DOCUMENTS

| | | | | |
|---|---|---|---|---|
| 2011/0112676 | A1* | 5/2011 | Izumi | G05B 19/41865 |
| | | | | 700/101 |
| 2011/0289443 | A1* | 11/2011 | Heaven | G06Q 10/06398 |
| | | | | 715/772 |
| 2012/0323350 | A1* | 12/2012 | Yamamoto | G05B 11/42 |
| | | | | 700/97 |
| 2016/0330040 | A1* | 11/2016 | Jeon | G06F 3/0481 |
| 2018/0286723 | A1* | 10/2018 | Fujiki | H01L 21/67276 |

* cited by examiner

Fig. 8H

| | First Value | Second Value |
|---|---|---|
| H.P. | H.P. | H.P. |
| Valve | ⊠ | ⊠ |
| Sensor | ○ | ○ |
| Robot | Robot Accessing | Robot Accessing |
| | 881 | 882 |

Fig. 8G

| H.P. | H.P. |
|---|---|
| Valve | ⊠ |
| Sensor | ○ |
| Robot | Robot Accessing |
| | 871 |

Fig. 10A

| No. | Unit No. | Message | Level | Occurrence Date | Recovery Date |
|---|---|---|---|---|---|
| 9852 | BATH | Presoak Bath:Automatic chemical dosing:Step CT/O | Warning | 2016/11/21 16:21:15 | 2016/11/21 16:22:15 |
| 10836 | FixSrd | Fix_L:Step CT/O | Heavy fault (T) | 2016/11/21 16:18:37 | 2016/11/21 19:32:02 |
| 1840 | Load | Robot : Step CT/O | Heavy fault (T) | 2016/11/21 16:15:53 | 2016/11/21 19:32:03 |
| 9852 | BATH | Presoak Bath:Automatic chemical dosing:Step CT/O | Warning | 2016/11/21 15:21:34 | 2016/11/21 15:22:34 |
| 2809 | Transporter | EES-PC:System Stop | Warning | 2016/11/17 19:18:02 | 2016/11/17 19:18:20 |
| 9852 | BATH | Presoak Bath:Automatic chemical dosing:Step CT/O | Warning | 2016/11/17 18:21:19 | 2016/11/17 18:22:19 |
| 11406 | CSUA | Main Tank:Filter Maintenance Door Lock Error | Heavy fault (P) | 2016/11/17 17:44:19 | 2016/11/17 17:45:42 |
| 11406 | CSUA | Main Tank:Filter Maintenance Door Lock Error | Heavy fault (P) | 2016/11/17 17:40:43 | 2016/11/17 17:43:54 |
| 9852 | BATH | Presoak Bath:Automatic chemical dosing:Step CT/O | Warning | 2016/11/15 14:57:22 | 2016/11/15 14:58:22 |
| 9916 | BATH | Plating AB Rinse Bath2:Supply cycle time over | Warning | 2016/11/15 14:04:54 | 2016/11/15 14:05:08 |
| 9904 | BATH | Plating AB Rinse Bath1:Supply cycle time over | Warning | 2016/11/15 14:03:12 | 2016/11/15 14:03:19 |
| 9864 | BATH | Presoak Rinse Bath1:Supply cycle time over | Warning | 2016/11/15 14:02:14 | 2016/11/15 14:02:57 |
| 9874 | BATH | Presoak Rinse Bath2:Supply cycle time over | Warning | 2016/11/15 14:01:06 | 2016/11/15 14:02:13 |
| 9940 | BATH | Plating AB Rinse Bath4:Supply cycle time over | Warning | 2016/11/15 14:00:15 | 2016/11/15 14:01:53 |
| 9864 | BATH | Presoak Rinse Bath1:Supply cycle time over | Warning | 2016/11/15 13:58:42 | 2016/11/15 13:59:11 |
| 9852 | BATH | Presoak Bath:Automatic chemical dosing:Step CT/O | Warning | 2016/11/15 13:57:22 | 2016/11/15 13:58:22 |

| Carrier | Port | Slot | Recipe | Result | Alarm | Start Date | End Date |
|---|---|---|---|---|---|---|---|
| CARRIER 1 | 1 | 7 | rec1 | Normal End(10260) | 2 | 2016/11/15 12:16:16 | 2016/11/15 12:18:13 |
| CARRIER 1 | 1 | 6 | rec1 | Normal End(10260) | 1 | 2016/11/15 12:14:14 | 2016/11/15 12:15:59 |
| CARRIER 1 | 1 | 5 | rec1 | Normal End(10260) | 3 | 2016/11/15 12:08:56 | 2016/11/15 12:13:13 |
| CARRIER 1 | 1 | 4 | rec1 | Normal End(10260) | 3 | 2016/11/15 12:07:33 | 2016/11/15 12:07:59 |
| CARRIER 1 | 1 | 3 | rec1 | Normal End(10260) | 3 | 2016/11/15 12:05:00 | 2016/11/15 12:07:01 |

1110 / 1120 / 1130

METHOD OF CONTROLLING DISPLAY OF OPERATION OF SEMICONDUCTOR MANUFACTURING APPARATUS AND NON-TRANSITORY COMPUTER READABLE STORAGE MEDIUM THEREFOR, AND SYSTEM FOR PERFORMING DISPLAY CONCERNING OPERATION OF SEMICONDUCTOR MANUFACTURING APPARATUS

CROSS-REFERENCE TO RELATED APPLICATION

This application is based upon and claims benefit of priority from Japanese Patent Application No. 2017-070972 filed on Mar. 31, 2017, the entire contents of which are incorporated herein by reference.

TECHNICAL FIELD

The present invention relates to a display concerning an operation of a semiconductor manufacturing apparatus.

BACKGROUND ART

In a semiconductor manufacturing apparatus, the states of semiconductor devices including the state of a semiconductor substrate which is being manufactured are monitored. The history of alarms corresponding to abnormalities, etc. in the states and the history of semiconductor manufacturing processes, etc. are displayed on a computer that is directly or indirectly connected to the apparatus. When a trouble has occurred in the semiconductor manufacturing apparatus, past operations of the semiconductor manufacturing apparatus are estimated on the basis of the history data displayed on the computer or the like. The history data which includes characters and numerical values are not easily understandable by people. To analyze the data, significant time and effort are required.

In this regard, for example, Japanese Patent Laid-Open No. 2015-211133 (see paragraphs [0022] to [0032] and FIG. 1, etc.) proposes, as one example of a semiconductor manufacturing apparatus, a chemical mechanical polishing (hereinafter, referred to as "CMP") apparatus having a function for determining variables (e.g., torque current D1 for rotating a table driving motor) concerning an operation condition which may cause an abnormality.

According to the above technology, for example, the torque current D1 for rotating the table driving motor can be identified as the cause of an abnormality. However, there has been no technology for making the development of an abnormality easily understandable.

PATENT LITERATURE

PTL 1: Japanese Patent Laid-Open No. 2015-211133

SUMMARY OF INVENTION

Technical Problem

The present invention has been made in view of the above circumstances, and a problem to be solved by the present invention is to provide an animation by which development of a certain condition such as a trouble in a semiconductor manufacturing apparatus is made easily understandable.

Solution to Problem

In order to solve the aforementioned problem, an embodiment of the present invention provides a computer program for causing one or more computers to perform a method of controlling a display concerning a semiconductor manufacturing apparatus. The method includes: repeatedly acquiring a state of one or more devices included in the semiconductor manufacturing apparatus; providing a first animation which indicates an operation of the semiconductor manufacturing apparatus by displaying at least an image indicating the state of one or more devices on a display unit each time the state is acquired; storing, in a memory, the acquired state of one or more devices and a time related to the state; receiving an input for switching a display mode; and providing a second animation of the semiconductor manufacturing apparatus by displaying, on the display unit, at least one or more images one by one after receiving the input for switching a display mode, the one or more images respectively indicating the state of one or more devices, which are stored in the memory, related to one or more times including a reference time.

In one embodiment, the method further includes: displaying, on the display unit, a graph including a band which indicates an alarm generated in the semiconductor manufacturing apparatus, the graph having an axis corresponding to a time, one end of the band corresponding to a generation time of the alarm, the other end corresponding to a restoration time of the alarm; and receiving a selection of a point or the band on the displayed graph such that a time corresponding to the selected point or the generation time or the restoration time related to the selected band is set as the reference time.

In one embodiment, the method further includes: displaying a log of a process executed in the semiconductor manufacturing apparatus; and receiving a selection of a process in the displayed log such that a time related to the selected process is set as the reference time.

In one embodiment, the method further includes: displaying a Gantt chart concerning the semiconductor manufacturing apparatus, the Gantt chart having one axis corresponding to a time, the Gantt chart including a band which indicates a process executed by at least one device included in the semiconductor manufacturing apparatus, one end of the band corresponding to a start time of the state, the other end corresponding to an end time of the state; and receiving a selection of a point or the band on the displayed Gantt chart such that a time corresponding to the selected point or the start time or the end time related to the selected band is set as the reference time.

In one embodiment, the method further includes: displaying, on the display unit, a control corresponding to at least one of playback, fast forward, frame-by-frame playback, pause, reverse frame-by-frame playback, fast rewind, and reverse playback; and receiving a selection of the displayed control; and controlling, in accordance with the selected control, the second animation indicating an operation of the semiconductor manufacturing apparatus.

In one embodiment, the semiconductor manufacturing apparatus is a plating apparatus.

In order to solve the aforementioned problem, an embodiment of the present invention provides a non-transitory computer readable storage medium storing the computer program.

In order to solve the aforementioned problem, an embodiment of the present invention provides a method of controlling a display concerning a semiconductor manufacturing apparatus. The method includes: repeatedly acquiring a state of one or more devices included in the semiconductor manufacturing apparatus; providing a first animation which indicates an operation of the semiconductor manufacturing apparatus by displaying, on a display unit, at least an image indicating the state of one or more devices each time the state is acquired; storing, in a memory, the acquired state of one or more devices and a time related to the state; receiving an input for switching a display mode; and providing a second animation which indicates an operation of the semiconductor manufacturing apparatus by displaying, on the display unit, at least one or more images one by one after receiving the input for switching a display mode, the one or more images respectively indicating the state of one or more devices related to one or more times including a reference time stored in the memory.

In order to solve the aforementioned problem, an embodiment of the present invention provides a system of performing a display concerning a semiconductor manufacturing apparatus. The system includes: first computer configured to repeatedly acquire a state of one or more devices included in the semiconductor manufacturing apparatus; second computer configured to store the acquired state of one or more devices and a time related to the state; third computer configured to provide an animation which indicates an operation of the semiconductor manufacturing apparatus, the third computer being configured to provide a first animation which indicates an operation of the semiconductor manufacturing apparatus by displaying at least an image indicating the state of one or more devices each time the state is acquired if a display mode is set to a first mode, and to provide a second animation which indicates an operation of the semiconductor manufacturing apparatus by displaying, on the display unit, at least one or more images one by one if the display mode is set to a second mode, the one or more images respectively indicating the state of one or more devices, which is stored in the second computer, related to one or more times including a reference time; and fourth computer configured to receive an input for switching the display mode at least between the first mode and the second mode.

In one embodiment, a plurality of the first computer exist, each of the plurality of the first computer repeatedly acquires a state of one or more devices included in a corresponding semiconductor manufacturing apparatus among different semiconductor manufacturing apparatuses, and at least a part of a communication path among the plurality of first computer, the second computer, the third computer, and the fourth computer is wireless.

Advantageous Effects of Invention

According to an embodiment of the present invention, such an animation as to make development of a certain condition in a semiconductor manufacturing apparatus easily understandable can be provided.

BRIEF DESCRIPTION OF DRAWINGS

FIG. 8G shows an area 720 where a digital value related to an operation of a semiconductor manufacturing apparatus 110 is provided;
FIG. 8H shows an image which indicates various digital values;
FIG. 10A shows an alarm history in a table form;
FIG. 11A shows a process history in a table form.

DESCRIPTION OF EMBODIMENTS

Hereinafter, an embodiment of the present invention is described in detail with reference to the drawings. The following description is merely an example according to the embodiment of the present invention. Accordingly, the present invention is not limited to the following description, and various modifications can be made within the scope without departing from the gist of the invention.

1 the Structure of a System According to an Embodiment of the Present Invention

Figure 1:
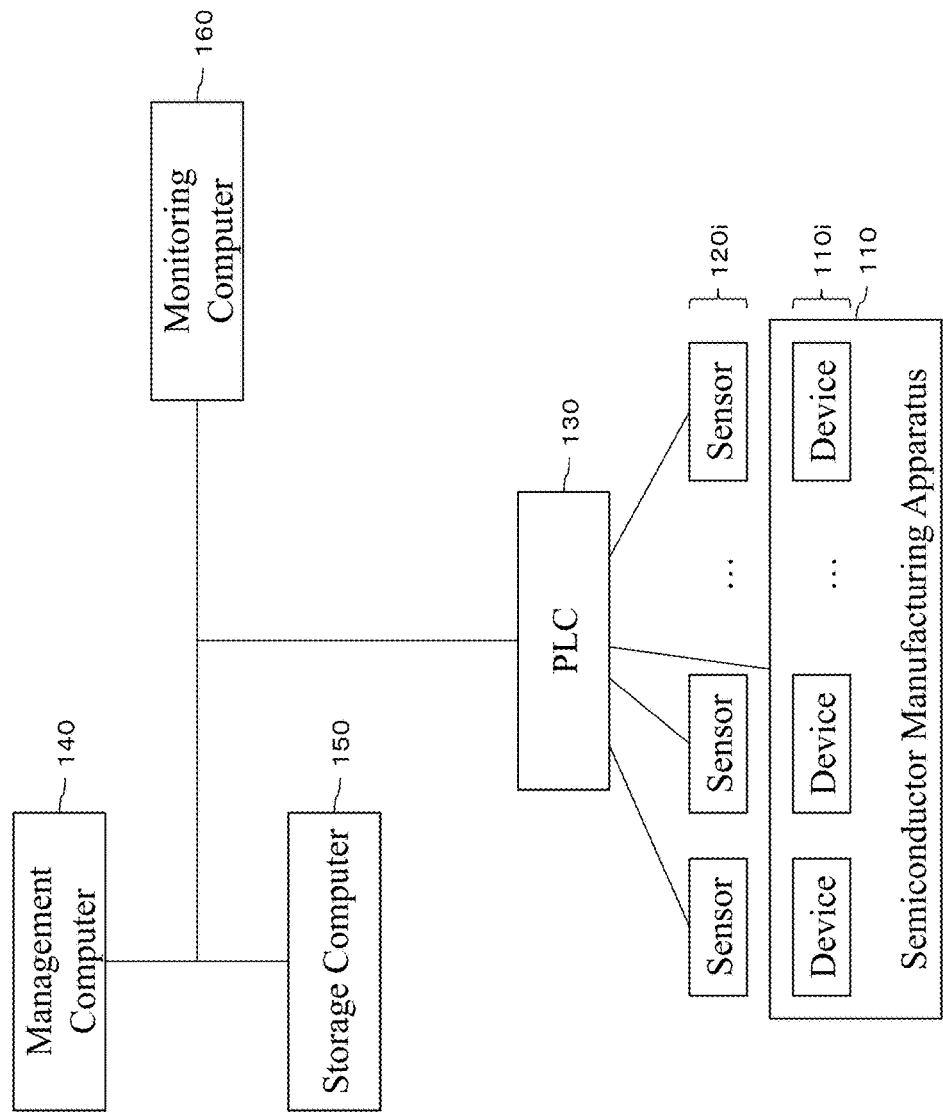
FIG. 1 illustrates the configuration of a system according to an embodiment of the present invention.

FIG. 1 illustrates the configuration of a system according to an embodiment of the present invention. The blocks in FIG. 1 represent components of the system. In FIG. 1, straight lines connecting the components to each other represent main transmission routes for information (including signals and data, etc.) among the components. At least one of two components connected with each other by one of the straight lines can transmit information to the other component. At least one of two components connected with each other by one of the straight lines may transmit information via another component or an element that is not illustrated. Transmission of information between components that are not connected with each other is not intended to be excluded. Note that the components and the straight lines are illustrated in FIG. 1 without regard to the actual sizes, arrangement, or layout, etc. of the components.

Reference numeral 110 denotes a semiconductor manufacturing apparatus including one or more devices 110$i$. Examples of the semiconductor manufacturing apparatus 110 include a plating or electrolytic plating apparatus, an exposure apparatus, an etching apparatus, a rear surface polishing apparatus, and a CMP apparatus. Examples of the devices 110$i$ included in the semiconductor manufacturing apparatus 110 include a substrate holder conveyance device, a cleaning module, a polishing module, a plating module, various robots, various actuators, various motors, various valves, and various sensors. In the following description, the devices 110*i* are assumed to include a substrate holder conveyance device.

Reference numeral 120*i* denotes one or more sensors for acquiring the states of the devices 110*i*. Examples of the sensor for the substrate holder conveyance device include a contact sensor and an optical sensor. Examples of the states include the position and angle of a hand included in the substrate holder conveyance device, the open/closed states of a shutter related to the substrate holder conveyance device, and the substrate number of a substrate set on the substrate holder conveyance device. In FIG. 1, the devices correspond to the sensors on a one-to-one basis. However, FIG. 1 merely illustrates an example. A plurality of the sensors may be provided for one of the devices, or only one of the sensors is provided for a plurality of the devices. Further, in FIG. 1, the devices 110*i* are separated from the sensors 120*i*. However, some of the devices may be provided with the sensors or some the devices may serve also as the sensors, as described above for the devices 110*i*. Moreover, the semiconductor manufacturing apparatus 110 may include a device to which no sensor corresponds.

Reference numeral 130 denotes a programmable logic controller (hereinafter, referred to as "PLC") which is a kind of a computer for controlling the semiconductor manufacturing apparatus 110. The PLC 130 is connected directly or indirectly to the devices 110*i* (the connection is not illustrated), and controls operations of the devices in accordance with a time table (described later) or an instruction from another computer. The PLC 130 is connected to the sensors 120*i*, receives signals from the sensors, and acquires the states of the devices on the basis of the signals. Further, the PLC 130 generates animation data and alarm/process data and transmits the data to a computer (described later).

Reference numeral 140 denotes a computer (hereinafter, referred to as "management computer") for determining an operation schedule of the semiconductor manufacturing apparatus 110 and managing an operation of the semiconductor manufacturing apparatus 110. The management computer 140 transmits a time table according to the operation schedule to the PLC 130 and computers described later. At the management computer 140, information about a substrate related to manufacturing is inputted and the operation schedule is determined on the basis of at least the information.

Reference numeral 150 denotes a computer (hereinafter, referred to as "storage computer") for storing animation data received from the PLC 130 and time tables received from the management computer 140.

Reference numeral 160 denotes a computer (hereinafter, referred to as "monitoring computer") for monitoring an operation of the semiconductor manufacturing apparatus 110 by providing at least an animation which indicates the operation of the semiconductor manufacturing apparatus 110 on the basis of the animation data received from the PLC 130. The monitoring computer 160 also provides an animation which indicates an operation of the semiconductor manufacturing apparatus 110, based on the animation data received from the storage computer 150. Further, the monitoring computer 160 performs a display based on the alarm/process data received from the PLC 130 and also performs a display based on the time table received from the storage computer 150. The monitoring computer 160 can at least temporarily store the received animation data, the received alarm/process data, and the received time table.

The number of at least the semiconductor manufacturing apparatuses 110, the PLCs 130, the management computers 140, the storage computers 150, or the monitoring computers 160 (hereinafter, referred to as "PLC 130 and others") may be two or more. Two or more of the PLC 130 and others may be a physically single computer.

2 Flow of a Method According to an Embodiment of the Present Invention

Figure 2:
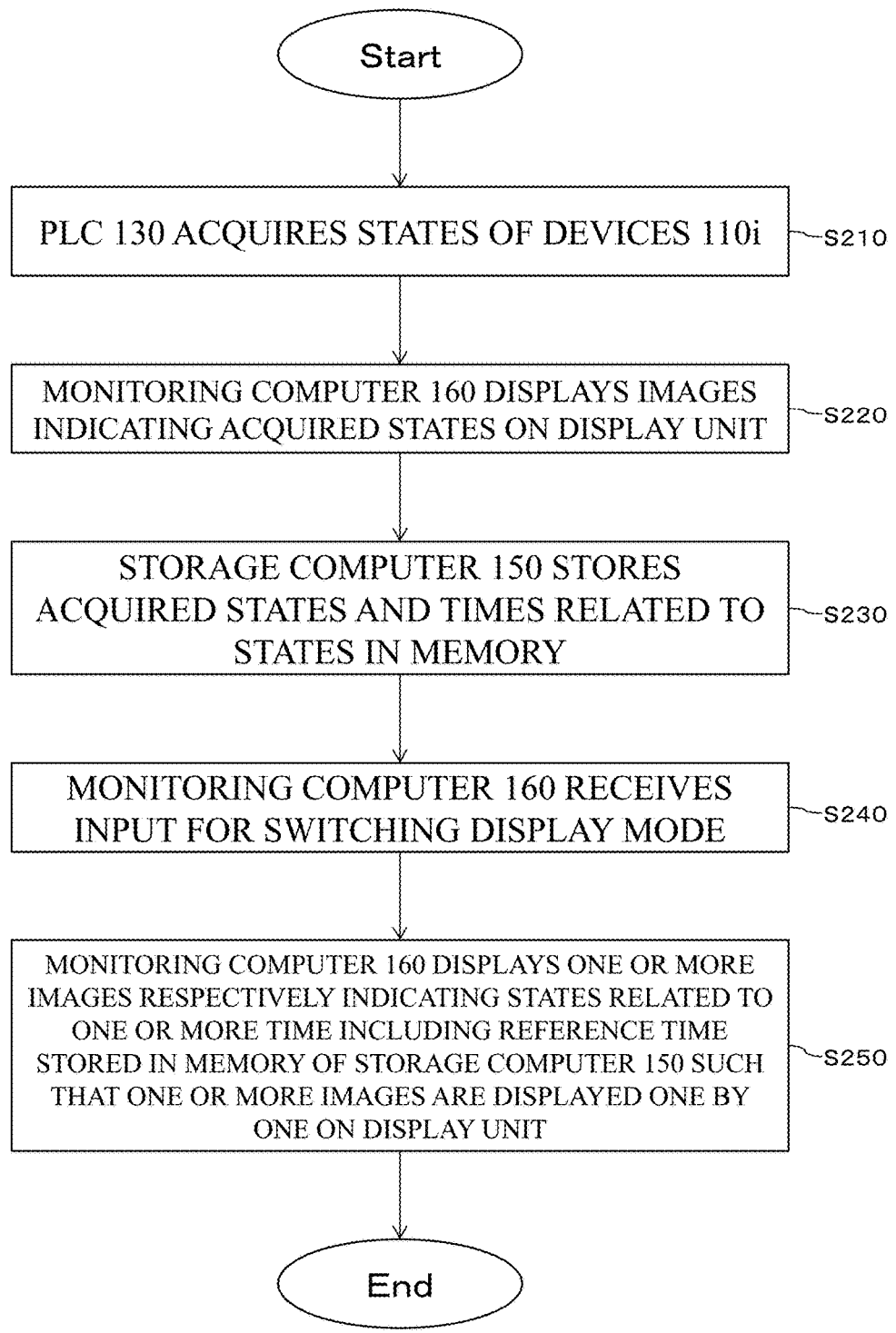
FIG. 2 is a flowchart of a method according to the embodiment of the present invention.

FIG. 2 is a flowchart of a method according to the embodiment of the present invention.

At step S210, the PLC 130 acquires the states of the devices 110*i*. The states of the devices 110*i* can be acquired on the basis of signals from the sensors 120*i*. Step S210 is repeated, that is, is executed a plurality of times.

At step S220, the monitoring computer 160 displays, on a display unit, an image indicating the acquired states of the devices 110*i*. The monitoring computer 160 can acquire the acquired states of the devices 110*i* from the animation data received from the PLC 130. The "image indicating the states of devices" is described later. Step S220 is executed each time the states of the devices 110*i* are acquired. Accordingly, a first animation which indicates an operation of the semiconductor manufacturing apparatus 110 is provided. A delay in a time period from the generation of signals at the sensors 120*i* to displaying of the image for provision of the first animation is preferably as little as possible such that the first animation indicates a real-time operation of the semiconductor manufacturing apparatus 110.

At step S230, the storage computer 150 stores, in a memory, the acquired states of the devices 110*i* and times related to the states. The storage computer 150 can acquire, from the animation data received from the PLC 130, the states of the acquired devices 110*i* and times related to the states. The "times related to the states" are described later. Since step S210 for acquiring the states of the devices 110*i* are executed a plurality of times, as described above, a plurality of sets of the states of the devices 110*i* and the times related to the states are stored in the memory of the storage computer 150.

At step S240, the monitoring computer 160 receives an input for switching a display mode. Prior to step S240, the monitoring computer 160 may display a button for switching the display mode on the display unit such that an input for switching the display mode is provided by a selection of the displayed button. A display of the button is described later.

At step S250, the monitoring computer 160 displays one or more images which indicate one or more images related to one or more times including a reference time stored in the memory of the storage computer 150, such that the one or more images are displayed one by one on the display unit. At an arbitrary time point prior to the display, the monitoring computer 160 can request the storage computer 150 to transmit stored animation data related to one or more times including the reference time. The "reference time" is described later with reference to FIGS. 3 to 5. Hereinafter, the "image indicating a state related to a time" is also referred to as an "image related to a time". An image to be first displayed at step S250 may be an image related to the reference time. Accordingly, a second animation indicating an operation of the semiconductor manufacturing apparatus 110 is provided. The second animation indicates a past operation of the semiconductor manufacturing apparatus 110.

Figure 3:
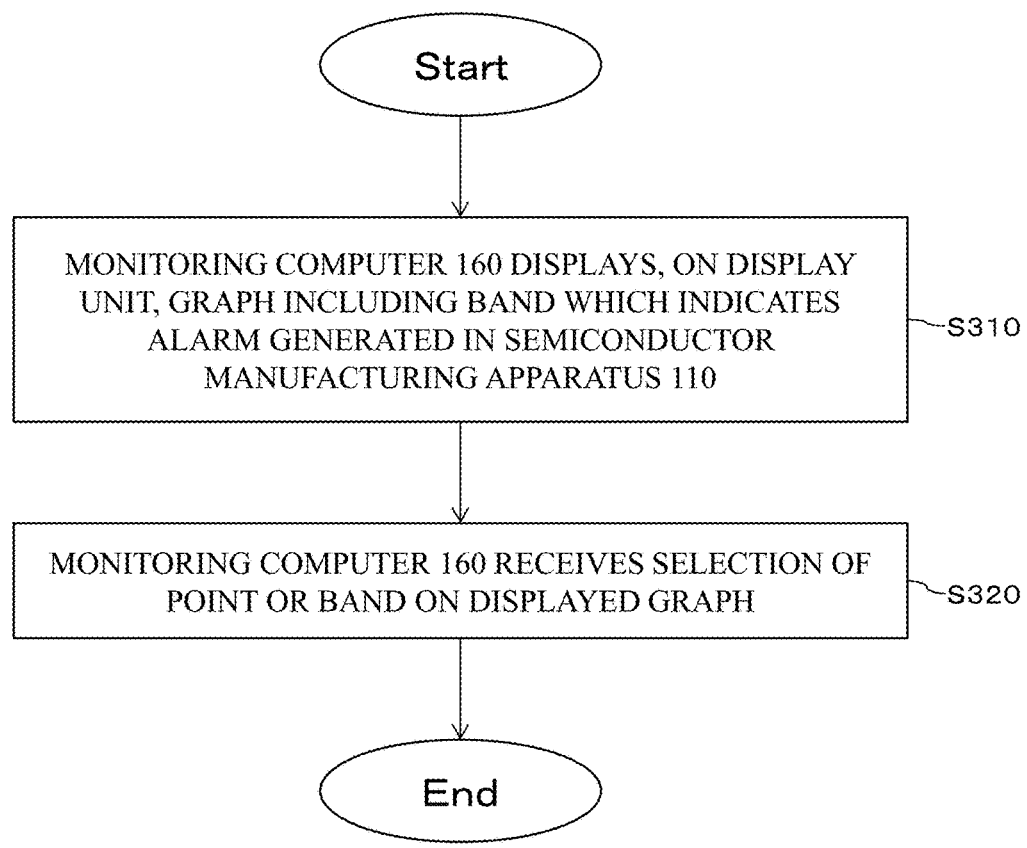
FIG. 3 is a flowchart of a first method for setting a reference time.

FIG. 3 is a flowchart of a first method for setting a reference time.

At step S310, the monitoring computer 160 displays, on the display unit, a graph including a band which indicates an alarm generated in the semiconductor manufacturing apparatus 110. The monitoring computer 160 can acquire the alarm from alarm/process data received from the PLC 130. The graph includes multiple axes, one of which corresponds to a time. One end of the band included in the graph corresponds to a generation time of the alarm, and the other end corresponds to a restoration time of the alarm. A display of the graph is described later.

At step S320, the monitoring computer 160 receives a selection of a point on the displayed graph or a selection of the band. When receiving a selection of a point on the displayed graph, the monitoring computer 160 can set, as the reference time, a time corresponding to the point. When receiving a selection of the band, the monitoring computer 160 can set, as the reference time, the generation time or restoration time of the alarm indicated by the band.

Figure 4:
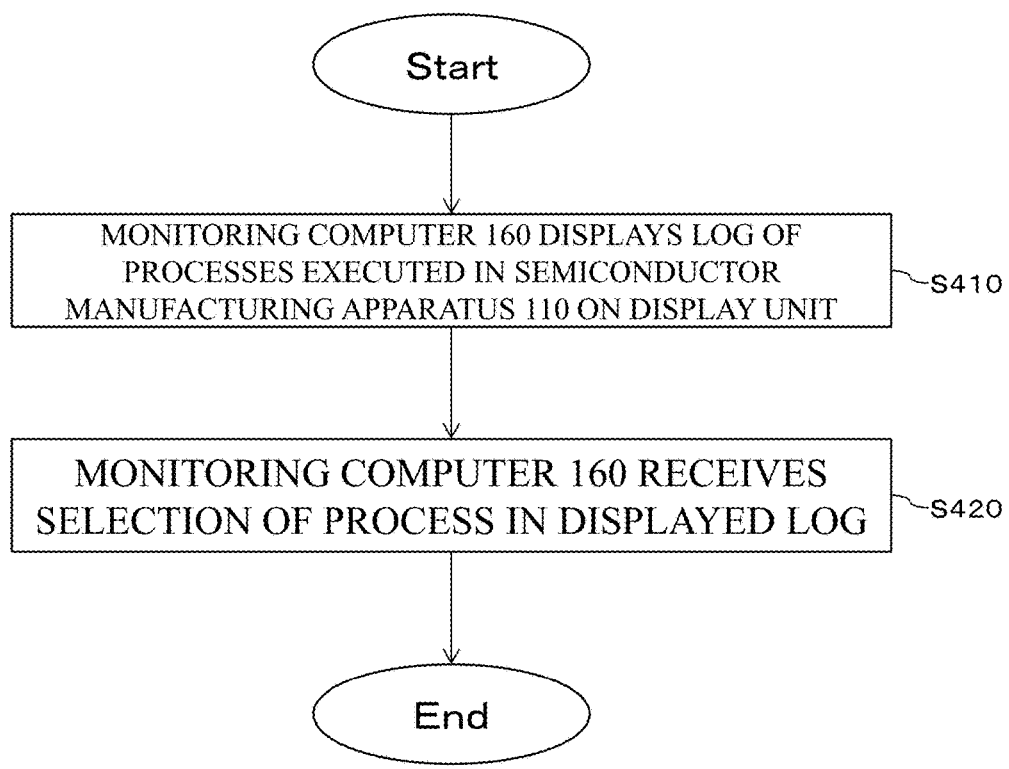
FIG. 4 is a flowchart of a second method for setting the reference time.

FIG. 4 is a flowchart of a second method for setting the reference time.

At step S410, the monitoring computer 160 displays, on the display unit, a log of processes executed in the semiconductor manufacturing apparatus 110. The monitoring computer 160 can acquire the log of processes from alarm/process data received from the PLC 130. A display of the log is described later.

At step S420, the monitoring computer 160 receives a selection of a process in the displayed log. The monitoring computer 160 can set, as the reference time, a time related to the selected process such as the start time or end time of the process.

Figure 5:
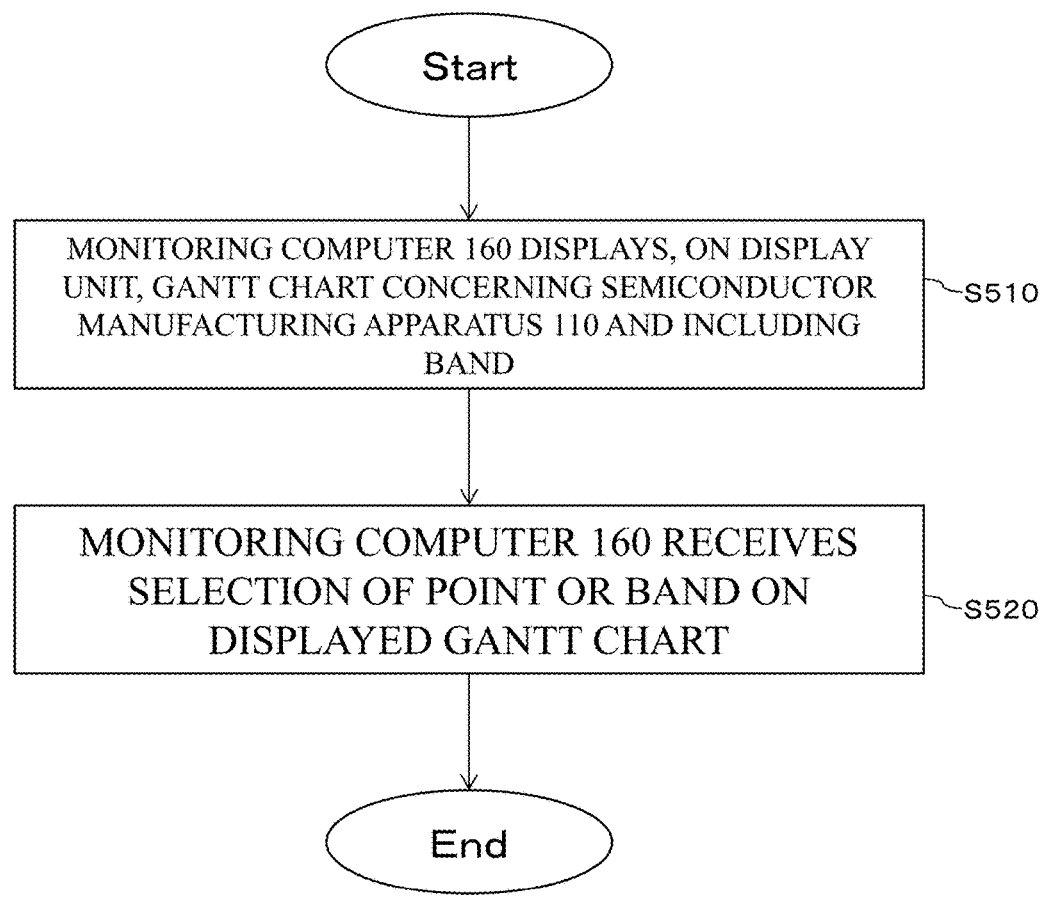
FIG. 5 is a flowchart of a third method for setting the reference time.

FIG. 5 is a flowchart of a third method for setting the reference time.

At step S510, the monitoring computer 160 displays, on the display unit, a Gantt chart which includes a band and which is related to the semiconductor manufacturing apparatus 110. The Gantt chart has a plurality of axes, one of which corresponds to a time. The Gantt chart includes a band indicating a process executed by the devices. One end of the band corresponds to the start time of the process, and the other end corresponds to the end time of the process. The monitoring computer 160 can acquire a process executed by the devices, from alarm/process data received from the PLC 130. A display of the Gantt chart is described later.

At step S520, the monitoring computer 160 receives a selection of a point in the displayed Gantt chart or a selection of the band. When receiving a selection of a point, the monitoring computer 160 can set, as the reference time, a time corresponding to the point. When receiving a selection of the band, the monitoring computer 160 can set, as the reference time, a time related to the band such as the start time or end time of a state indicated by the band.

A method for setting the reference time is not limited to the three methods described above. For example, the monitoring computer 160 may receive a direct input of a time and set the time as the reference time. The monitoring computer 160 may set the reference time by any other arbitrary method.

Figure 6:
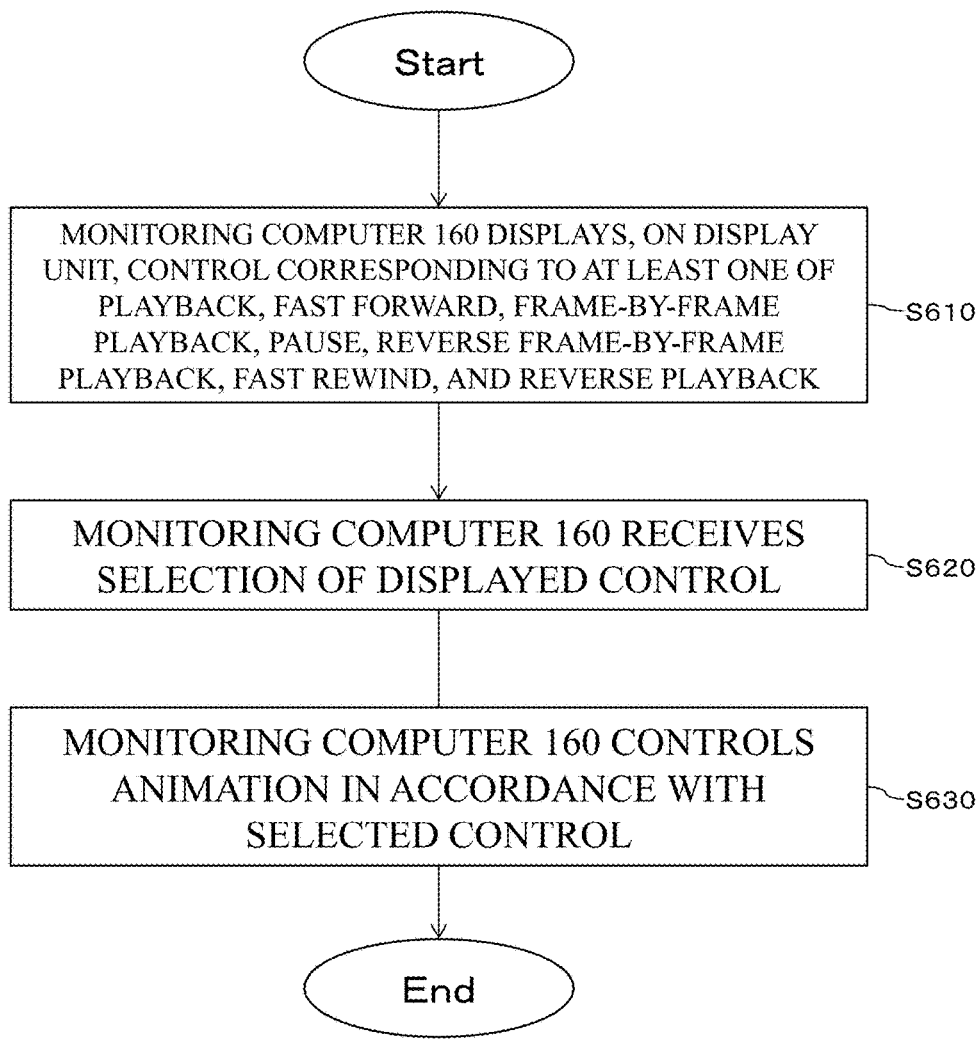
FIG. 6 is a flowchart of a method of controlling playback of an animation.

FIG. 6 is a flowchart of a method of controlling playback of an animation, particularly, the second animation.

At step S610, the monitoring computer 160 displays, on the display unit, a control corresponding to at least one of playback, fast forward, frame-by-frame playback, pause, reverse frame-by-frame playback, fast rewind, and reverse playback. A display of the control is described later.

At step S620, the monitoring computer 160 receives a selection of the displayed control.

At step S630, the monitoring computer 160 controls the second animation in accordance with the selected control.

As described above, one or more images related to one or more times including the reference time are displayed one by one on the display unit, whereby the second animation is provided. The images respectively indicate states related to one or more times including the reference time, stored in the memory of the storage computer 150.

When receiving a selection of the control corresponding to playback, the monitoring computer 160 may control the second animation such that images related to times, which are later than a time related to the last displayed image, are displayed, in the order of the earlier-time related images, one by one at a reference predetermined time interval. The reference predetermined time interval may be a time interval at which the states of the devices 110$i$ are acquired by the PLC 130, and more specifically, an interval of one second, for example.

When receiving a selection of the control corresponding to fast forward, the monitoring computer 160 may control the second animation such that images related to times, which are later than a time related to the last displayed image, are displayed, in the order of earlier time-related images, one by one at an interval shorter than the reference predetermined interval, or every other image or every third image among the images is displayed at the reference predetermined interval.

When receiving a selection of the control corresponding to frame-by-frame playback, the monitoring computer 160 may control the second animation such that one image related to a time, which is later than a time related to the last displayed image, is displayed. The control corresponding to frame-by-frame playback may be configured to be able to be selected only when a display of a certain image continues, for example, immediately after the control corresponding to pause is selected (described later).

When receiving a selection of the control corresponding to pause, the monitoring computer 160 may control the second animation such that any other image is not further displayed until a further selection of the control is received, in other words, such that a display of the last displayed image continues.

For the control corresponding to reverse playback or fast rewind, the second animation is controlled in the same way as that for the control corresponding to playback or fast forward respectively, except that images related to times, which are later than a time related to the last displayed image, are not displayed in the order of earlier time-related images, but images related to times, which are earlier than the time related to the last displayed image, are displayed in the order of later time-related images.

For the control corresponding to reverse frame-by-frame playback, the second animation is controlled in the same way as that for the control corresponding to frame-by-frame playback, except that one image related to a time, which is later than a time related to the last displayed image, is not displayed but one image related to a time, which is earlier than the time related to the last displayed image, is displayed.

3 Data Generated by the PLC 130

3-1 Animation Data

The PLC 130 generates animation data as described above. Animation data includes data indicating a time related to a state of a certain device and data indicating the state. Examples of the "time related to a state" include a time at which a signal for acquiring the state is generated or transmitted by a sensor, a time at which the PLC 130 receives the signal, a time at which the PLC 130 acquires the state on the basis of the signal, and a time at which the PLC 130 generates one animation data set corresponding to the state. The "time" includes "date and time". One animation data set is expressed by the following form, for example:

{t, $S_1$, $S_2$, ..., $S_n$}

In the above form, t represents data indicating a time related to a state of a certain device. $S_1$, $S_2$, ..., $S_n$ each represent a parameter of the state, and represent, as the whole, data indicating the state. n represents an integer of 1 or greater, and depends on the number of parameters for expressing the state of the device. Animation data may include data for uniquely identifying a corresponding device, e.g., a device number.

3-2 Alarm/Process Data

The PLC 130 generates alarm/process data, as described above. Alarm/process data includes data about an alarm and data about a process. Data about an alarm includes data indicating the contents of the alarm and includes data indicating the generation time and the restoration time of the alarm. Data about a process includes data indicating the contents of the process and includes data indicating the start time and the end time of the process.

4 Data Generated by the Management Computer 140

The management computer 140 generates a time table, as described above. A time table is data indicating an operation to be carried out at a certain time by the device 110*i*. A time table may be generated for each device or each device group. A time table may be additionally generated at a predetermined timing for one device or one device group. For example, when new information about a substrate to be manufactured may be inputted to the management computer 140 after a certain time table is generated, change of an operation schedule may be required. In this case, a new time table may be generated in consideration of the new inputted information about a substrate to be manufactured. Accordingly, a time table may include information for identifying the time table itself from among a plurality of time tables, e.g., data indicating the generation time of the time table.

5 Data Stored in the Storage Computer 150

The storage computer 150 receives animation data from the PLC 130 and stores a plurality of received animation data sets, as described above. The storage computer 150 can store animation data in a table form. For example, animation data about the substrate holder conveyance device can be stored as the following table.

TABLE 1

| t | $s_1$ | $s_2$ | $s_3$ | $s_4$ | |
|---|---|---|---|---|---|
| | | | | | (1) |
| 2016 Dec. 26 10:10:08 | 0 | 0 | 0 | 0 | (2) |
| 2016 Dec. 26 10:10:09 | 0 | 0 | 1 | 0 | (3) |
| 2016 Dec. 26 10:10:10 | 0 | 1 | 1 | 0 | (4) |
| 2016 Dec. 26 10:10:11 | 0 | 1 | 1 | 45 | (5) |
| 2016 Dec. 26 10:10:12 | 0 | 0 | 1 | 45 | (6) |
| 2016 Dec. 26 10:10:13 | 90 | 0 | 0 | 45 | (7) |

In the table, numerals (1) to (7) and line (1) are given just for convenience of explanation, and may not be included in the animation data. The column $S_1$ corresponds to an arm angle (°). The column $S_2$ corresponds to a hand position (0: rearward, 1: forward). The column $S_3$ corresponds to the open/closed state of a shutter (0: closed, 1: open). The column $S_4$ corresponds to the substrate number of a set substrate (0 represents the state where no substrate is set). The storage computer 150 can store, as animation data for each device, a table as shown above.

In addition, the storage computer 150 stores a time table from the PLC 130 and stores a plurality of the received time table sets, as described above.

6 Screen Displayed on the Monitoring Computer 160

6-1 Monitoring Mode Screen

Figure 7:
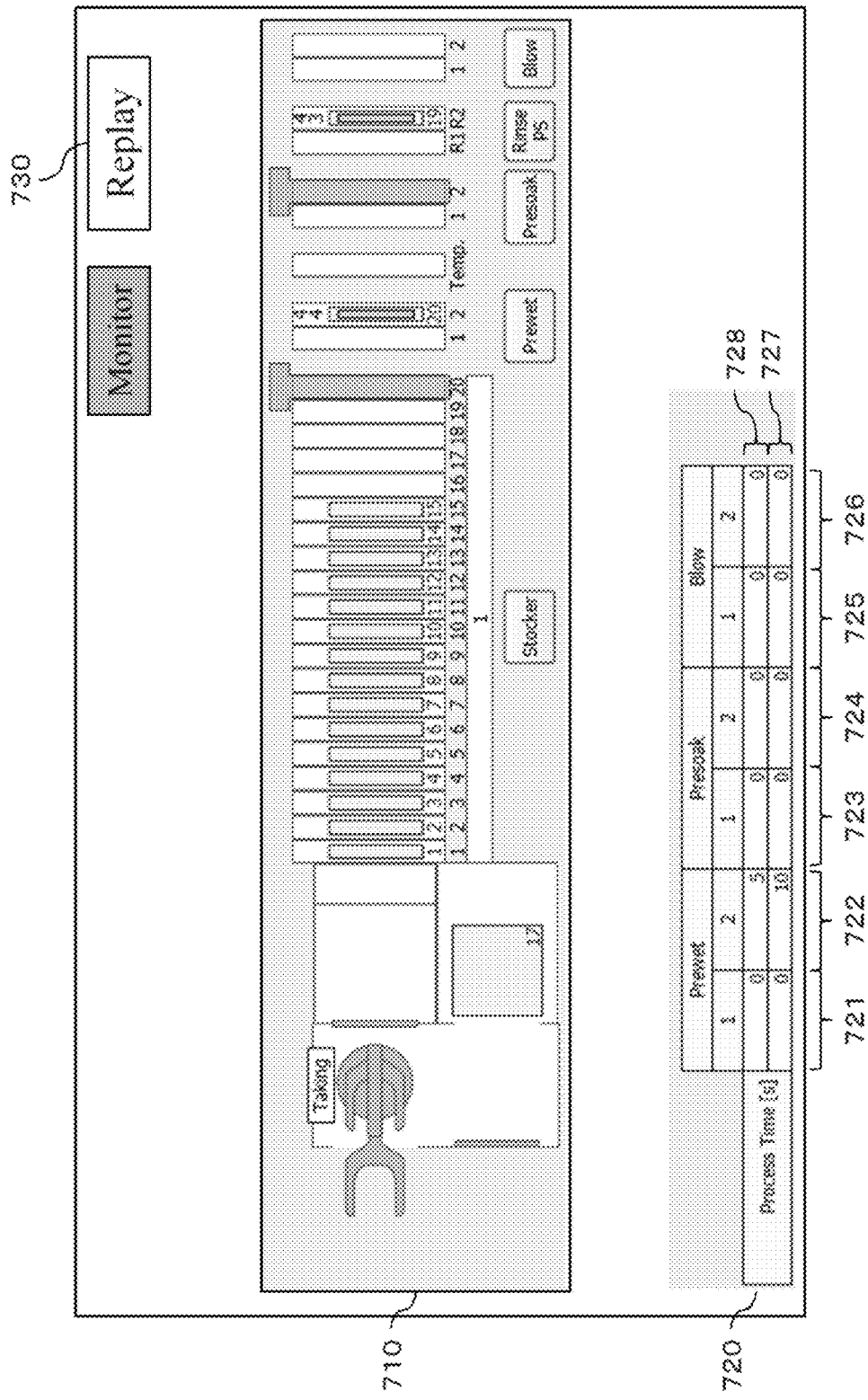
FIG. 7 shows a monitoring mode screen.
Figure 8C:
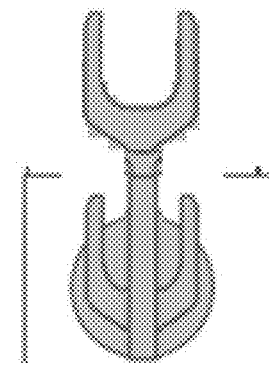
FIGS. 8A to 8F show images indicating states of a substrate holder conveyance device at different times.
Figure 8B:
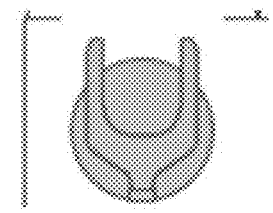
Figure 8A:
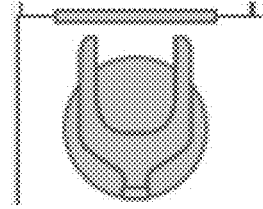
Figure 8F:
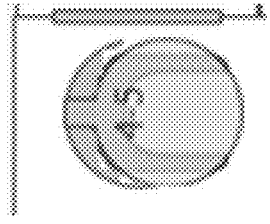
Figure 8E:
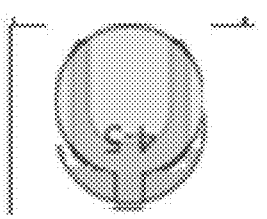
Figure 8D:
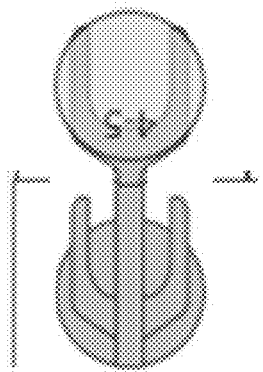

FIG. 7 shows a monitoring mode screen which is a screen for providing the first animation. Reference numeral 710 denotes an area where the first animation is provided. Reference numeral 720 denotes an area where analog values concerning an operation of the semiconductor manufacturing apparatus 110 is provided. Reference numeral 730 denotes a button for switching the display mode. When the button is pressed down, the screen is shifted to a replay mode screen (described later).

The area 710 is described in detail with reference to FIGS. 8A to 8F. FIGS. 8A to 8F show images indicating states of a substrate holder conveyance device at different times. FIGS. 8A to 8F correspond to the states shown in lines (2) to (7) of the above table, respectively. As shown in FIGS. 8A to 8F, the area 710 is formed of a part where a display, which shows an image indicating a state of the device 110*i*, changes and a part (a background) where a display does not change. That is, the part where an image indicating a state of the device 110*i* is displayed is updated with the elapse of time so that the area 710 as a whole provides an animation indicating an operation of the semiconductor manufacturing apparatus 110.

An image corresponding to a state of the device 110*i* and the background image may be stored in the monitoring computer 160 in advance, or may be acquired from another computer by the monitoring computer 160 at an arbitrary time point before being displayed.

Further, the monitoring computer 160 may provide a smoother animation by, at a time after a display of an image (hereinafter, referred to as "first image") related to a certain time and before a display of an image (hereinafter, referred to as "second image") related to the following time, displaying one or more images for complementing the first image and the second image. Alternatively, the image related to a certain time may be one frame image forming a video image having a predetermined length. In this case, the video image including, as one frame, the image related to the certain time is reproduced, whereby the image can be displayed.

In the area 720, columns 721 and 722 indicate "Prewet" process-related times [s] at a first device and a second device, respectively, which are each related to the "Prewet" process. Columns 723 and 724 indicate "Presoak" process-related times [s] at the first device and the second device, respectively, which are related to the "Presoak" process. Columns 725 and 726 indicate "Blow" process-related times [s] at the first device and the second device, respectively, which are related to the "Blow" process. A row 727 indicates respective setting values of the times [s], that is, expected times required for the corresponding processes. A setting value or expected time of "0" indicates that the corresponding process is not to be executed or is not being executed at this time point. A row 728 indicates times having passed from the start of the corresponding processes or times actually taken to complete the corresponding processes.

In the area 710 or the area 720, a digital value (which takes only two values) concerning an operation of the semiconductor manufacturing apparatus 110 may be provided. Alternatively, on another screen which is displayed upon pressing down of a process button ("Prewet", "Presoak", or "Blow") in the area 710 or the area 720, digital values of the respective devices related to the corresponding processes may be displayed. FIG. 8G shows one example of the area 710 or 720 when a digital value is provided. A second column 871 of a table shown in FIG. 8G includes, from the top row, an image indicating whether or not the semiconductor manufacturing apparatus 110 is at a home position, an image indicating whether or not a certain valve is on, an image indicating whether or not a certain sensor is on, and an image indicating whether or not a certain robot is in operation. These images are described in detail with reference to FIG. 8H. Images shown in a first column 881 of a table shown in FIG. 8H are examples in a case where the digital value is a first value. From the top row in the column 881, an example of an image indicating that the semiconductor manufacturing apparatus 110 is not at the home position, an example of an image indicating that the certain valve is off, an example of an image indicating that the certain sensor is off, and an example of an image (a background image) indicating that the certain robot is not in operation, are shown. Images shown in a second column 882 of a table shown in FIG. 8H are examples in a case where the digital value is a second value. From the top row in the column 882, an example of an image indicating that the semiconductor manufacturing apparatus 110 is at the home position, an example of an image indicating that the certain valve is on, an example of an image indicating that the certain sensor is on, and an example of an image indicating that the certain robot is in operation, are shown. In addition, to indicate the condition of a robot, a display of "accessing" or "putting" shown in the lowest row of the column 882 in FIG. 8H may be displayed near the robot in the area 710.

When an analog value and/or a digital value is provided with use of images, an image indicating the analog value and/or the digital value may be displayed as a part of an animation in the area 710. The analog value and/or the digital value to be provided may be based on at least one of animation data, alarm/process data, a time table, and arbitrary data from an arbitrary computer (a description of which is omitted).

6-2 Replay Mode Screen

Figure 9:
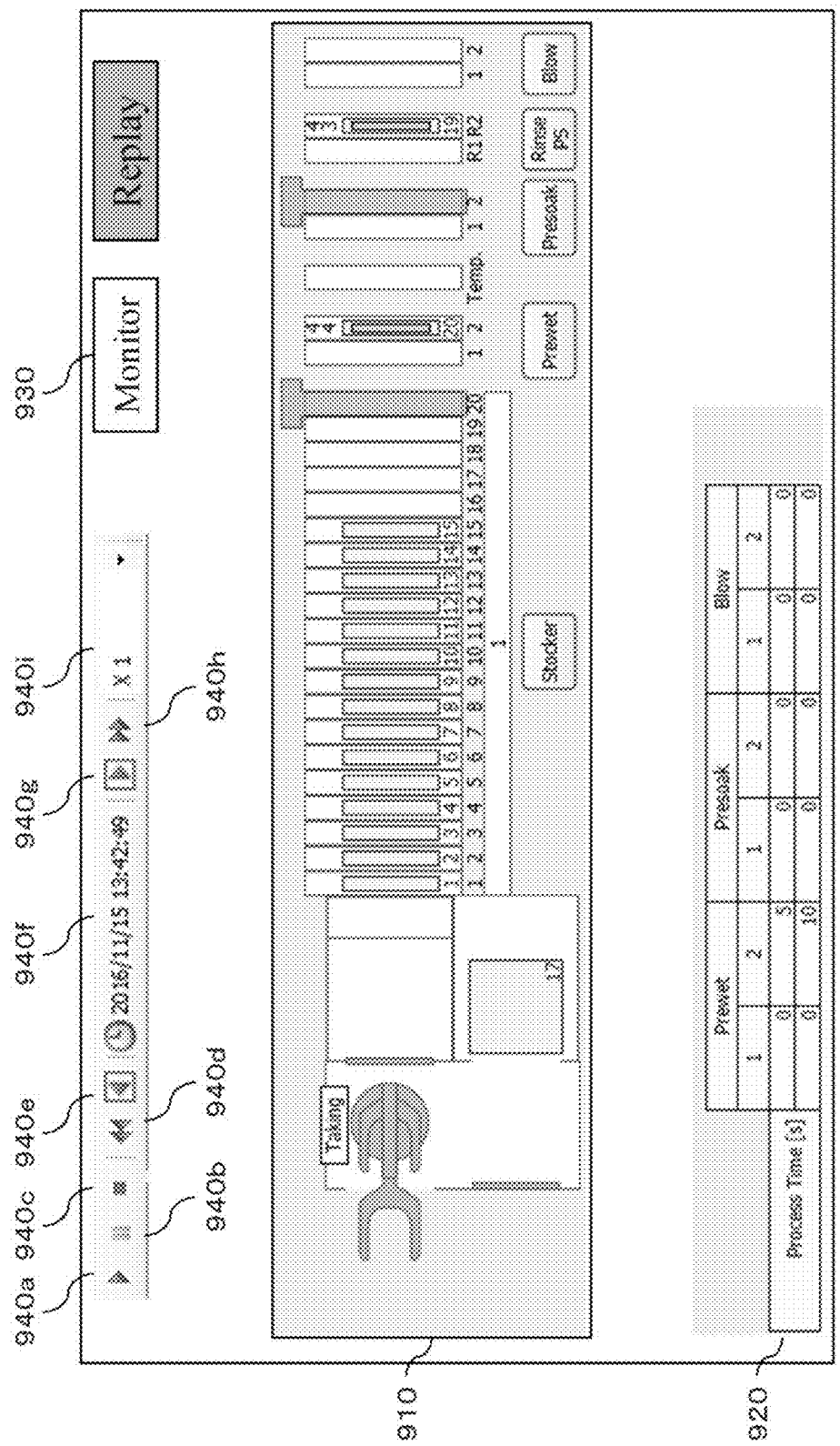
FIG. 9 shows a replay mode screen.

FIG. 9 shows a replay mode screen for providing the second animation. Reference numeral 910 denotes an area where the second animation is provided, and is identical to the area 710 except for a difference described later. Reference numeral 920 denotes an area where analog values concerning an operation of the semiconductor manufacturing apparatus 110 are provided, and is identical to the area 720 except for a difference described later. Reference numeral 930 denotes a button for switching the display mode. When the button is pressed down, the screen is returned to the monitoring mode screen. Reference characters 940*a* to 940*i* denote controls for controlling the second animation. The controls 940*a*, 940*b*, 940*d*, 940*e*, 940*g*, and 940*h* correspond to playback, pause, fast rewind, reverse frame-by-frame playback, frame-by-frame playback, and fast forward, respectively. The control 940*c* corresponds to stop of an animation. By a selection of the control 940*c*, displays in the areas 910 and 920 are returned to those of the reference time. Through the control 940*f*, a time is directly inputted. Through the control 940*i*, the speed of fast forward and the speed of fast rewind, such as an interval at which images are displayed or the number of images displays of which are omitted, are set.

The area 910 differs from the area 710 in that a portion of the area 910 where an image indicating a state of the device 110*i* is displayed is updated not with the elapse of a time but according to a time (hereinafter, corresponding to a playback point (described later)) which moves forward, rearward, or stops via a selection of any one of the controls 940*a* to 940*i*, whereby the area 910 as the whole provides an animation indicating an operation of the semiconductor manufacturing apparatus 110.

The area 920 differs from the area 720 in that, in the area 920, analog values (and/or a digital value) concerning an operation of the semiconductor manufacturing apparatus 110 are displayed and updated not with the elapse of a time but according to a time which moves forward, rearward, or stops via a selection of any one of the controls 940*a* to 940*i*.

6-3 Display Screen for Alarm History

The monitoring computer 160 can display an alarm history on the basis of alarm/process data received from the PLC 130.

FIG. 10A shows an alarm history in a table form. The first row in the table indicates labels for respective columns. The second and lower rows each indicate one alarm. In a portion 1010, a plurality of columns indicating the details of the corresponding alarms are shown. In particular, the first column in the portion 1010 shows unique values of the respective alarm types. In a portion 1020, a column showing generation times of the alarms is shown. In a portion 1030, a column showing restoration times of the alarms is shown. Upon receiving a selection of the column showing the generation time or restoration time of an alarm of a certain row, the monitoring computer 160 can set, as the reference time of the second animation, the corresponding generation time or restoration time of the alarm.

Figure 10B:
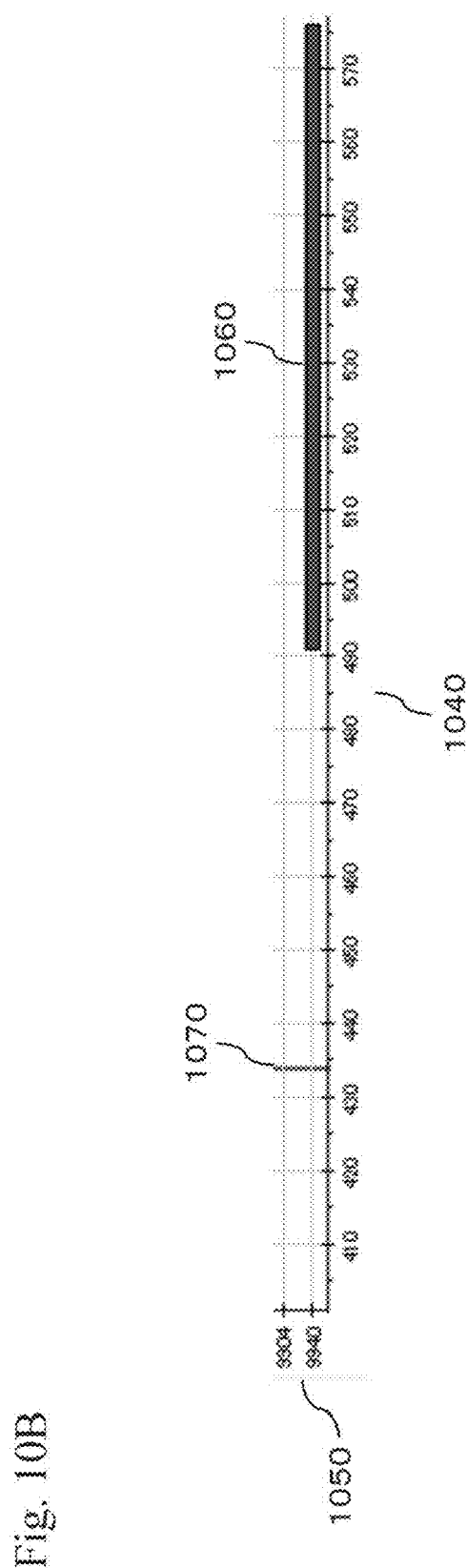
FIG. 10B shows an alarm history in a graph form.

FIG. 10B shows an alarm history in a graph form. Reference numeral 1040 denotes a graph axis corresponding to a time. The scale of the axis 1040 indicates an elapsed time relative to a certain time. Reference numeral 1050 denotes a graph axis corresponding to an alarm type. The scale value of the axis 1050 is unique to each alarm type. Reference numeral 1060 denotes a band corresponding to one alarm. The left end of the band corresponds to the generation time of an alarm, and the right end of the band corresponds to the restoration time of the alarm. Upon receiving a selection of a point on the graph, the monitoring computer 160 can set, as the reference time of an animation, a time corresponding to the selected point. Upon receiving a selection of the band on the graph, the monitoring computer 160 can set, as the reference time of an animation, the generation time or restoration time of the alarm corresponding to the selected band. Reference numeral 1070 is described later.

Figure 10C:
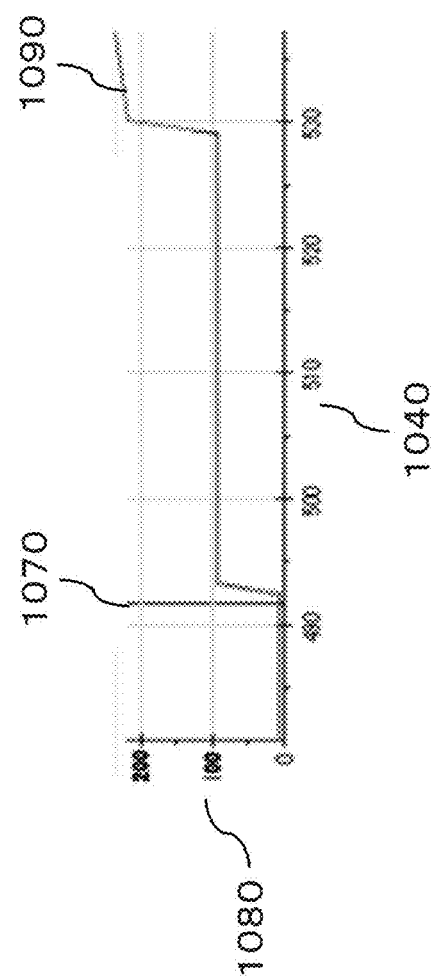
FIG. 10C shows an operation history of a device in a graph form.

FIG. 10C shows an operation history of one device in a graph form. Since a display of such a graph of a device that has generated an alarm is particularly useful, a display of an operation history of a device is included in the display of an alarm history in the present embodiment. The following description is on the assumption that the device according to the operation history shown in FIG. 10C is a motor such as a forward/rearward driving motor of a robot arm. Reference numeral 1040 in FIG. 10C denotes the same as that in FIG. 10B. Reference numeral 1080 denotes a graph axis corresponding to the ratio of torque of the motor to a rated value, and the unit thereof is %. When the motor is not operating, the value of the ratio is 0, and when the motor is normally operating, the value of the ratio is 100. Reference numeral 1090 denotes a temporal plot of the ratio of the torque to the rated value. Upon receiving a selection of a point on the graph, the monitoring computer 160 can set, as the reference time of an animation, a time corresponding to the selected point. Upon receiving a selection of a singular point on the plot or a point near the singular point (in a case where the monitoring computer 160 is configured to be able to recognize a singular point) on the graph, the monitoring computer 160 can set, as the reference time of an animation, a time corresponding to the selected singular point. Whether or not the selected point is near a singular point is determined on the basis of whether or not the distance between the selected point and the singular point recognized by the monitoring computer 160 is equal to or shorter than a predetermined distance which is 0 or larger (the unit thereof is arbitrarily defined). A singular point refers to a point, on the plot, at which any abnormality can be estimated to occur or to start to occur in a device, and is described later with reference to FIGS. 10D to 10G.

The monitoring computer 160 can display, concurrently with the replay mode screen, at least one of the alarm history in a table form, the alarm history in a graph form, and the operation history of one device in a graph form. Reference numeral 1070 in FIGS. 10B and 10C denotes a playback point of the second animation that is currently provided in the replay mode screen. Here, a time corresponding to the playback point 1070 matches the reference time immediately after the reference time is set. However, note that the time corresponding to the playback point 1070 and the reference time basically refer to different times because the playback point changes by provision of an animation whereas the reference time does not change unless setting thereof is carried out.

Figure 10E:
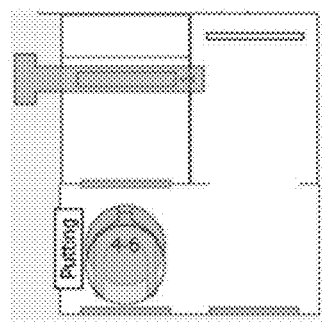
FIGS. 10E and 10G each show a part, at playback positions shown in FIGS. 10D and 10F, respectively, of an area 910 where the second animation is provided.
Figure 10G:
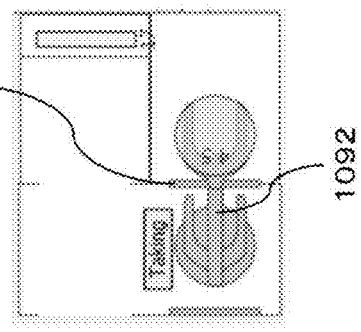
Figure 10D:
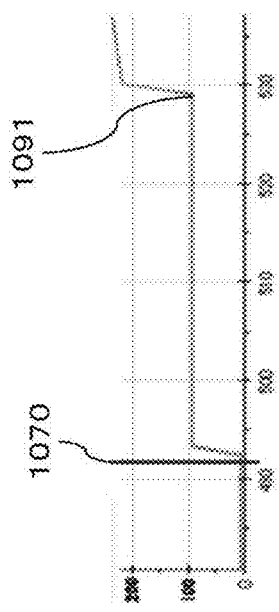
FIGS. 10D and 10F respectively show operation histories of the same device in different graph forms.
Figure 10F:
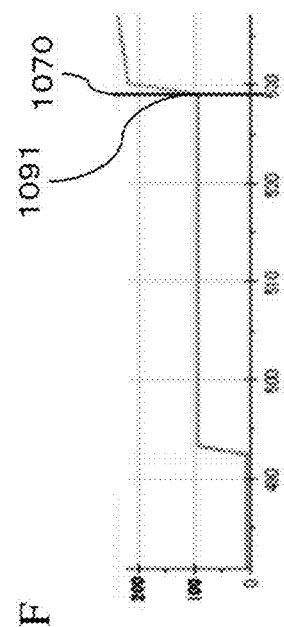

A specific example of a case where an operation history of one device in a graph form is displayed concurrently with the replay mode screen, is described below. FIGS. 10D and 10F show graphs indicating operation histories of the same device and differing from each other in the playback point 1070. FIGS. 10E and 10G show a portion, on the replay mode screen, of the area 910 (FIG. 9) where the second animation is provided, at the playback points shown in FIGS. 10D and 10F, respectively. The portion includes an image indicating the state of the device. Reference numeral 1091 denotes a singular point. The singular points shown in FIGS. 10D and 10F is a point at which the ratio of the torque to a rated value exceeds 100%. The ratio exceeding 100% indicates that an excessive load is applied to the motor due to the occurrence of any trouble such as a collision.

When the playback point 1070 is positioned at the point shown in FIG. 10D, an image shown in FIG. 10E is displayed on the concurrently displayed replay mode screen. Here, the monitoring computer 160 receives a selection of the singular point 1091 on the plot or a point near the singular point 1091 on the graph. As a result, the reference time is set to a time corresponding to the singular point 1091, and the playback point 1070 moves to the point shown in FIG. 10F. At the same time, the image shown in FIG. 10E changes to the image shown in FIG. 10G on the replay mode screen. In the image shown in FIG. 10G, a shutter 1093 is closed although a robot arm 1092 is extended. Therefore, an actual state where the robot arm has collided with or is caught by the closed shutter or the shutter that is being closed, can be easily understood.

In this way, as a result of a display of at least one of an alarm history in a table form, an alarm history in a graph form, and an operation history of one device in a graph form with the replay mode screen, the state of the semiconductor manufacturing apparatus 110 at a remarkable arbitrary time point in the alarm history (including the operation history of the device) can be swiftly reproduced on the replay mode screen.

6-4 Display Screen for Process History

The monitoring computer 160 can display a process history on the basis of alarm/process data received from the PLC 130.

FIG. 11A shows a process history (log) in a table form. The first row in the table indicates labels for respective columns. The second and lower rows each indicate one process. In a portion 1110, a plurality of columns indicating the details of the corresponding processes are shown. In a portion 1120, a column showing start times of the processes is shown. In a portion 1130, a column showing end times of the processes is shown. Upon receiving a selection of the column showing the start time or end time of a process in a certain row, the monitoring computer 160 can set, as the reference time of the second animation, the corresponding start time or end time of the process. Upon receiving a selection of a column showing the start time or end time of a process in a certain row, the monitoring computer 160 can set, as the reference time of the second animation, the corresponding start time or end time of the process.

Figure 11B:
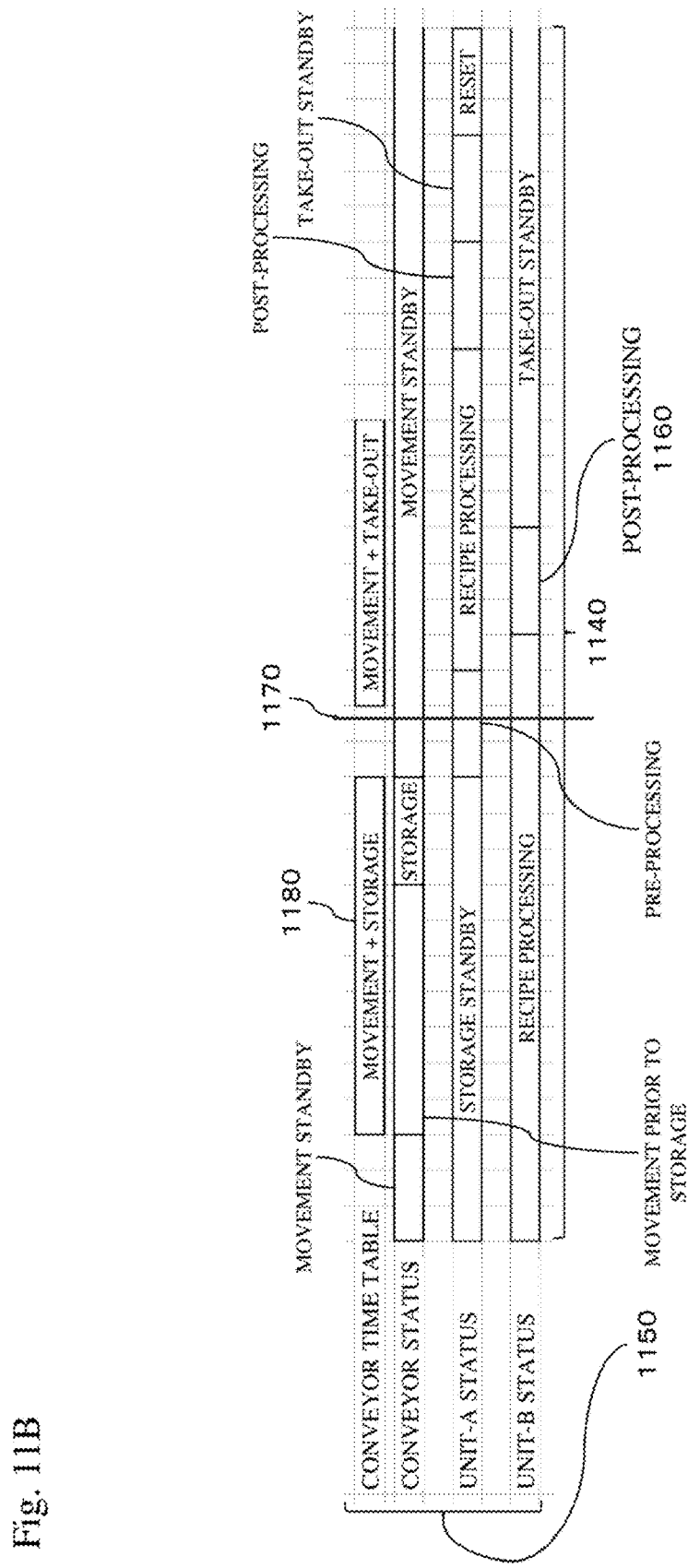
FIG. 11B shows a process history in a Gantt chart form.

FIG. 11B shows a process history in a Gantt chart form. Reference numeral 1140 denotes a Gantt chart axis corresponding to a time. Reference numeral 1150 denotes Gantt chart axes corresponding to the respective devices 110i. Reference numeral 1160 (one section both ends of which are defined by vertical lines) denotes each band corresponding to a process. One band corresponds to one process. The left end of each band corresponds to the start time of the corresponding process, and the right end of each band corresponds to the end time of the corresponding process. Each of the bands 1160 can include a label (e.g., "post-processing") indicating a process. Upon receiving a selection of a point on the Gantt chart, the monitoring computer 160 can set, as the reference time of an animation, a time corresponding to the selected point. Upon receiving a selection of the band on the Gantt chart, the monitoring computer 160 can set, as the reference time of an animation, the start time or end time of the process corresponding to the selected band.

The monitoring computer 160 can display, concurrently with the replay mode screen, a process history in a table form or in a Gantt chart form. In FIG. 11B, reference numeral 1170 denotes a playback point of the second animation which is currently provided on the replay mode screen. Here, note that a time corresponding to the playback point 1170 matches a reference time immediately after the reference time is set. As a result of a display of a process history in a table form or in a Gantt chart form with the replay mode screen, the state of the semiconductor manufacturing apparatus 110 at a remarkable arbitrary time point in the process history can be swiftly reproduced on the replay mode screen.

Further, the monitoring computer 160 can include a time table in the process history in a Gantt chart form. Reference numeral 1180 in FIG. 11B denotes a band corresponding to a time table. The left end of a band corresponding to a time table corresponds to the start time of a certain operation, and the right end of the band corresponds to the end time of the operation. Each of the bands 1180 can include a label (e.g., "movement+storage") indicating the operation. Upon receiving a selection of a band corresponding to a time table, the monitoring computer 160 can set, as the reference time of an animation, the start time or end time of the operation corresponding to the selected band. The monitoring computer 160 requests the storage computer 150 to transmit a stored time table corresponding to a time included in a Gantt chart that is to be displayed by the monitoring computer 160.

7 Another Configuration of System According to Embodiment of Present Invention

Figure 12:
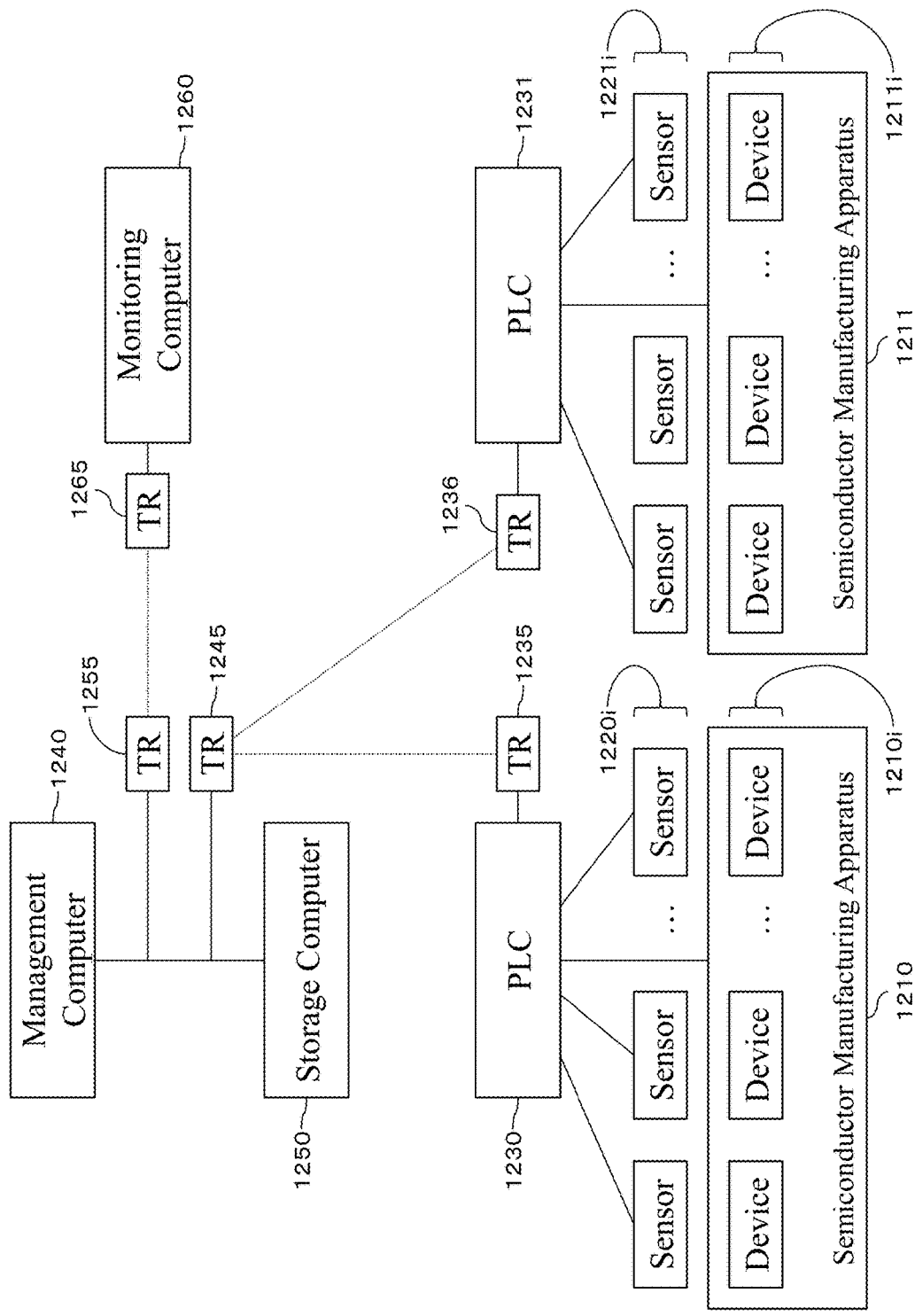
FIG. 12 illustrates another configuration of the system according to the embodiment of the present invention.

FIG. 12 illustrates another configuration of the system according to the embodiment of the present invention. The blocks in FIG. 12 represent components of the system. In FIG. 12, straight lines connecting the components to each other represent main transmission routes for information among the components. At least one of two components connected with each other by one of the straight lines can transmit information to the other component. In particular, the solid lines indicate routes capable of transmitting information via wires, and the broken lines indicate routes capable of transmitting information wirelessly. At least one of two components connected with each other by one of the straight lines may transmit information via another component or an element not illustrated to the other component. However, transmission of information between components that are not connected with each other is not intended to be excluded. Note that the components and the straight lines are illustrated in FIG. 12 without regard to the actual sizes, arrangement, and layout, etc. of the components.

Reference numerals 1210 and 1211 denote semiconductor manufacturing apparatuses including one or more devices 1210i and 1211i, respectively. Reference numerals 1220i and 1221i denote sensors for acquiring states of the devices 1210i and 1211i, respectively. The semiconductor manufacturing apparatus 1210 and 1211, the devices 1210i and 1211i, the sensors 1220i and 1221i, are identical or similar to the semiconductor manufacturing apparatus 110, the devices 110i, the sensors 120i, respectively. The semiconductor manufacturing apparatuses 1210 and 1211 may be semiconductor manufacturing apparatuses of the same type, or semiconductor manufacturing apparatuses of the different types.

Reference numerals 1230 and 1231 denote PLCs similar to the PLC 130.

Reference numerals 1240, 1250, and 1260 denote computers similar to the management computer 140, the storage computer 150, and the monitoring computer 160, respectively.

Reference numerals 1235, 1236, 1245, 1255, and 1265 denote wireless units (TRs) conforming to arbitrary standards. A standard to which the TRs 1235, 1236, and 1245 conform may be a radio standard of a 920-MHz band, and a standard to which the TRs 1255 and 1265 conform may be a Wi-Fi standard. Compared with radio waves in a 2.4-GHz band (one of the frequency bands used by the Wi-Fi standard), radio waves in a 920-MHz band can ensure a longer communication distance, and further, are more advantageous in terms of lower power consumption. Alternatively, when communication with a mobile phone, a smartphone, or a wearable terminal is considered, those conforming to at least one of infrared communication, communication based on the ZigBee standard, communication based on the Bluetooth (registered trademark) standard, and communication based on the 802.11 standard may be adopted as the wireless units (TRs). According to the configuration illustrated in FIG. 12, the semiconductor manufacturing apparatuses 1210 and 1211, and the management PC 1240 and the storage computer 1250 can be disposed at separate locations without wiring being considered. Therefore, even in a wide area factory, a plurality of semiconductor manufacturing apparatuses which are disposed at separate locations can be handled by one set of a management PC and a storage computer. With this configuration, the monitoring computer 1260 can be disposed in an office, etc. remote from the factory without wiring being considered.

Another modification can be made the configuration of which is substantially the same as that in FIG. 12 except that the monitoring computer 1240, the storage computer 1250, the PLC 1230, and the PLC 1231 are connected to one another via wires such as LAN, in place of the TRs 1235, 1236, and 1245 in FIG. 12. In this case, signal data which indicates states of the devices and which is obtained from the sensors of the semiconductor manufacturing apparatus 1210 and/or 1211 can be stored, as appropriate, in the storage computer 1250 with high reliability. In addition, by use of wireless communication, only necessary data can be communicated, at an appropriate timing and appropriate frequency, with the monitoring computer 1260 that is disposed at a remote place or is set at a location such as a management house in a factory, for example.

The "computer" which the embodiment of the present invention uses is a stationary type in many cases. However, the "computer" may be a portable electronic device (an information device terminal) such as a laptop computer, a tablet PC, a mobile phone, a smartphone, or a wearable terminal. In this case, as a user interface, one integrally incorporated in the portable electronic device such as a wearable terminal may be used. As a wireless unit (TR) incorporated in the portable electronic device such as a wearable terminal, one supporting at least one of infrared communication, communication based on the ZigBee standard, communication based on the Bluetooth (registered trademark) standard, communication based on the 802.11 standard, and the like, may be adopted. In a case where the "computer" is formed of a portable electronic device as described above, a system can be provided which can sufficiently work when an operator wants to monitor the operation state of a semiconductor manufacturing apparatus regularly, irregularly, or at any timing while doing a different work. Accordingly, the operator does not need to constantly continue doing a work in front of a computer the set position of which is fixed at a certain position in a factory, whereby the work performance of the operator can be significantly improved.

8 "Computer"

Figure 13:
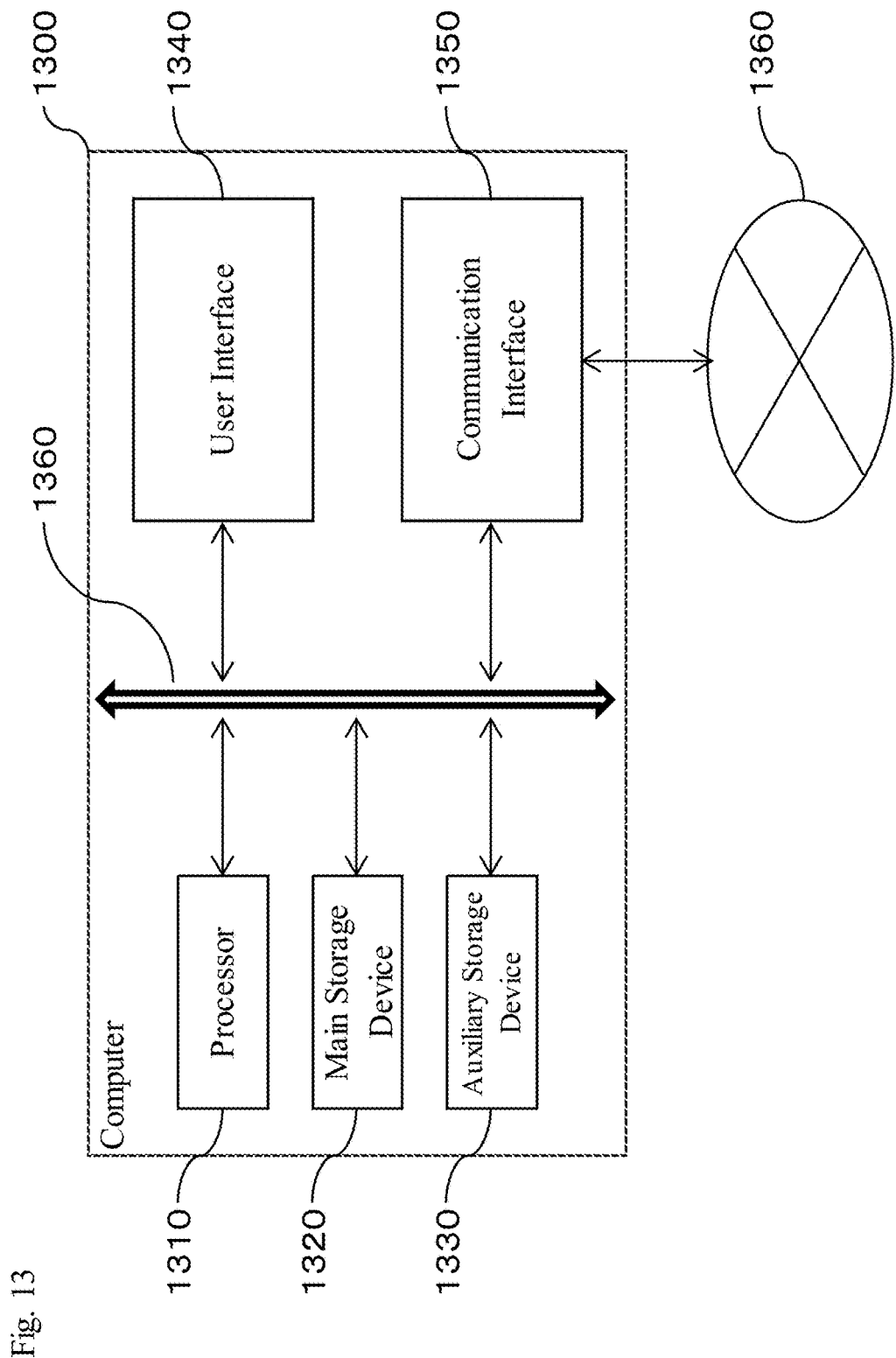
FIG. 13 illustrates one example of a hardware configuration of a computer.

Finally, a "computer" according to the present invention is described. FIG. 13 illustrates one example of the hardware configuration of the computer. As illustrated in FIG. 13, a computer 1300 mainly includes a processor 1310, a main storage device 1320, an auxiliary storage device 1330, a user interface 1340, and a communication interface 1350, which are connected to one another via a bus line 1360 examples of which include an address bus, a data bus, and a control bus. An interface circuit (not illustrated) may be interposed, as appropriate, between the bus line 1360 and each of the hardware resources.

The processor 1310 controls the entire computer.

The main storage device 1320 provides a work area to the processor 1310, and is a volatile memory such as an SRAM or a DRAM.

The auxiliary storage device 1330 stores a program, etc. which is software, various data, and the like, and is a non-volatile memory such as a hard disk drive or a flash memory. The program is loaded from the auxiliary storage device 1330 into the main storage device 1320, at an arbitrary time point, via the bus line 1360.

The user interface 1340 provides information to a user and/or receives an input of information from a user. For example, the user interface 1340 is a key board, a mouse, a display unit, a touch panel display, a microphone, a speaker, or the like.

The communication interface 1350 is connected to a network 1360, and transmits and receives data over the network 1360. The communication interface 1350 can be connected to the network 1360 via a wire or wirelessly. The communication interface 1350 may acquire information about the network such as information about a Wi-Fi access point or information about a base station of a communication carrier.

What is claimed is:

1. A method of controlling a display concerning a semiconductor manufacturing apparatus, the method comprising:
    repeatedly acquiring a state of one or more devices included in the semiconductor manufacturing apparatus;
    providing a first animation which indicates an operation of the semiconductor manufacturing apparatus by displaying at least an image indicating the state of one or more devices on a display unit each time the state is acquired;
    storing, in a memory, the acquired state of one or more devices and a time related to the state;
    receiving an input for switching a display mode;
    providing a second animation which indicates an operation of the semiconductor manufacturing apparatus by displaying, on the display unit, at least one or more images one by one after receiving the input for switching a display mode, the one or more images respectively indicating the state of one or more devices, which are stored in the memory, related to one or more times including a reference time;
    displaying, on the display unit, a graph including a band which indicates an alarm generated in the semiconductor manufacturing apparatus, the graph having an axis corresponding to a time, one end of the band corresponding to a generation time of the alarm, and the other end corresponding to a restoration time of the alarm; and
    receiving a selection of a point or the band on the displayed graph such that a time corresponding to the selected point or the generation time or the restoration time related to the selected band is set as the reference time.

2. The method according to claim 1, wherein the method further comprises:
    displaying, on the display unit, a log of a process executed in the semiconductor manufacturing apparatus; and
    receiving a selection of a process in the displayed log such that a time related to the selected process is set as the reference time.

3. The method according to claim 1, wherein the method further comprises:
    displaying, on the display unit, a Gantt chart concerning the semiconductor manufacturing apparatus, the Gantt chart having one axis corresponding to a time, the Gantt chart including a band which indicates a process executed by at least one device included in the semiconductor manufacturing apparatus, one end of the band corresponding to a start time of the state, and the other end corresponding to an end time of the state; and
    receiving a selection of a point or the band on the displayed Gantt chart such that a time corresponding to the selected point or the start time or the end time related to the selected band is set as the reference time.

4. The method according to claim 1, wherein the method further comprises:
    displaying, on the display unit, a control corresponding to at least one of playback, fast forward, frame-by-frame playback, pause, reverse frame-by-frame playback, fast rewind, and reverse playback;
    receiving a selection of the displayed control; and
    controlling, in accordance with the selected control, the second animation of the semiconductor manufacturing apparatus.

5. The method according to claim 1, wherein the semiconductor manufacturing apparatus is a plating apparatus.

6. A system of performing a display concerning a semiconductor manufacturing apparatus, the system comprising:
    a first computer configured to repeatedly acquire a state of one or more devices included in the semiconductor manufacturing apparatus;
    a second computer configured to store the acquired state of one or more devices and a time related to the state; and
    a third computer configured to provide an animation which indicates an operation of the semiconductor manufacturing apparatus, wherein the third computer being configured to:
        provide a first animation which indicates an operation of the semiconductor manufacturing apparatus by displaying at least an image indicating the state of one or more devices each time the state is acquired if a display mode is set to a first mode,
        provide a second animation which indicates an operation of the semiconductor manufacturing apparatus by displaying, on the display unit, at least one or more images one by one if the display mode is set to a second mode, the one or more images respectively indicating the state of one or more devices, which is stored in the second computer, related to one or more times including a reference time,
        receive an input for switching the display mode at least between the first mode and the second mode,
        display a graph including a band which indicates an alarm generated in the semiconductor manufacturing apparatus, the graph having an axis corresponding to a time, one end of the band corresponding to a generation time of the alarm, and the other end corresponding to a restoration time of the alarm, and
        receive a selection of a point or the band on the displayed graph such that a time corresponding to the selected point or the generation time or the restoration time related to the selected band is set as the reference time.

7. The system according to claim 6, wherein
    a plurality of the first computers exist, each of the plurality of the first computer repeatedly acquires a state of one or more devices included in a corresponding semiconductor manufacturing apparatus among different semiconductor manufacturing apparatuses, and at least a part of a communication path among the plurality of first computer, the second computer, and the third computer is wireless.

8. A non-transitory computer readable storage medium storing the computer readable instructions that upon execution on at least one computer cause a semiconductor manufacturing apparatus at least to:
  repeatedly acquire a state of one or more devices included in the semiconductor manufacturing apparatus;
  provide a first animation which indicates an operation of the semiconductor manufacturing apparatus by displaying at least an image indicating the state of one or more devices on a display unit each time the state is acquired;
  store, in a memory, the acquired state of one or more devices and a time related to the state;
  receive an input for switching a display mode; and
  provide a second animation which indicates an operation of the semiconductor manufacturing apparatus by displaying, on the display unit, at least one or more images one by one after receiving the input for switching a display mode, the one or more images respectively indicating the state of one or more devices, which are stored in the memory, related to one or more times including a reference time;
  display, on the display unit, a graph including a band which indicates an alarm generated in the semiconductor manufacturing apparatus, the graph having an axis corresponding to a time, one end of the band corresponding to a generation time of the alarm, and the other end corresponding to a restoration time of the alarm; and
  receive a selection of a point or the band on the displayed graph such that a time corresponding to the selected point or the generation time or the restoration time related to the selected band is set as the reference time.

9. The non-transitory computer readable storage medium according to claim 8, further comprising computer readable instructions that upon execution on the at least one computer further cause the semiconductor manufacturing apparatus at least to:
  display, on the display unit, a log of a process executed in the semiconductor manufacturing apparatus; and
  receive a selection of a process in the displayed log such that a time related to the selected process is set as the reference time.

10. The non-transitory computer readable storage medium according to claim 8, further comprising computer readable instructions that upon execution on the at least one computer further cause the semiconductor manufacturing apparatus at least to:
  display, on the display unit, a Gantt chart concerning the semiconductor manufacturing apparatus, the Gantt chart having one axis corresponding to a time, the Gantt chart including a band which indicates a process executed by at least one device included in the semiconductor manufacturing apparatus, one end of the band corresponding to a start time of the state, and the other end corresponding to an end time of the state; and
  receive a selection of a point or the band on the displayed Gantt chart such that a time corresponding to the selected point or the start time or the end time related to the selected band is set as the reference time.

11. The non-transitory computer readable storage medium according to claim 8, further comprising computer readable instructions that upon execution on the at least one computer further cause the semiconductor manufacturing apparatus at least to:
  display, on the display unit, a control corresponding to at least one of playback, fast forward, frame-by-frame playback, pause, reverse frame-by-frame playback, fast rewind, and reverse playback;
  receive a selection of the displayed control; and
  control, in accordance with the selected control, the second animation of the semiconductor manufacturing apparatus.

12. The non-transitory computer readable storage medium according to claim 8, wherein the semiconductor manufacturing apparatus is a plating apparatus.

* * * * *